(12) United States Patent
Jin et al.

(10) Patent No.: US 11,971,450 B2
(45) Date of Patent: Apr. 30, 2024

(54) ELECTRONIC TESTER AND TESTING METHOD

(71) Applicant: ROHDE & SCHWARZ GMBH & CO. KG, Munich (DE)

(72) Inventors: Yi Jin, Singapore (SG); KokMeng Wong, Singapore (SG)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 132 days.

(21) Appl. No.: 17/540,496

(22) Filed: Dec. 2, 2021

(65) Prior Publication Data

US 2023/0176124 A1 Jun. 8, 2023

(51) Int. Cl.
*G01R 31/00* (2006.01)
*G01R 31/3183* (2006.01)
*G01R 31/319* (2006.01)

(52) U.S. Cl.
CPC ............ *G01R 31/31905* (2013.01); *G01R 31/318307* (2013.01); *G01R 31/31912* (2013.01)

(58) Field of Classification Search
CPC ...... G01R 31/31905; G01R 31/318307; G01R 31/31912; G01R 31/2884; G01R 31/31924; G01R 31/31922; G01R 31/318511; G01R 31/318505; G01R 31/2831; G01R 31/318513; G01R 31/2632; G01R 31/2635; G01R 31/2608; G01R 31/2614; G01R 31/2621; G01R 31/275; G01R 31/31725; G01R 31/31937; G01R 31/31932; G01R 31/3193; G01R 31/31703; G01R 31/28; G01R 31/317; G01R 31/2891; G01R 31/2893; G01R 31/2896; G01R 31/2886; G01R 31/2877; G01R 31/2887

See application file for complete search history.

(56) References Cited

U.S. PATENT DOCUMENTS

| | | | | |
|---|---|---|---|---|
| 5,043,655 | A | * | 8/1991 | Anholm, Jr. ........ G01R 19/0092 361/87 |
| 6,611,152 | B1 | * | 8/2003 | Ortman ................ G01R 1/0408 324/756.07 |

(Continued)

FOREIGN PATENT DOCUMENTS

EP 3176591 B1 2/2020

*Primary Examiner* — Thang X Le
(74) *Attorney, Agent, or Firm* — Brooks Kushman P.C.

(57) ABSTRACT

The present disclosure provides an electronic tester comprising at least one test fixture that couples to a device under test, at least one test instrument coupled to at least one of the test fixtures that measures signals in the device under test, a test controller that controls the device under test while the test is performed, and an adapter module comprising a general control interface that is coupled to the test controller, and a DUT-specific communication interface that couples to the device under test to communicate with the device under test, wherein the test controller controls the device under test with generic control signals sent to the general control interface, and wherein the adapter module translates the general control signals into DUT-specific control signals and transmit the DUT-specific control signals to the device under test. Further, the present disclosure provides a respective method.

18 Claims, 5 Drawing Sheets

(56) References Cited

U.S. PATENT DOCUMENTS

| | | | |
|---|---|---|---|
| 2009/0192752 A1* | 7/2009 | Powers | G06F 11/2733 |
| | | | 702/117 |
| 2011/0153902 A1* | 6/2011 | Tsai | G06F 13/385 |
| | | | 710/313 |
| 2011/0291679 A1* | 12/2011 | Pagani | G01R 31/31926 |
| | | | 324/750.01 |
| 2012/0245879 A1* | 9/2012 | Mikkola | G01R 31/2884 |
| | | | 702/117 |
| 2017/0212164 A1* | 7/2017 | Caradonna | G01R 31/31905 |
| 2018/0067161 A1* | 3/2018 | Tadepalli | G01R 31/31908 |
| 2019/0238238 A1 | 8/2019 | Thiruvarankan | |
| 2020/0200821 A1 | 6/2020 | Freidhof et al. | |
| 2021/0029014 A1 | 1/2021 | Connolly et al. | |
| 2021/0302469 A1* | 9/2021 | Su | G01R 1/0416 |
| 2023/0100093 A1* | 3/2023 | Sauer | H04L 43/50 |
| | | | 714/724 |

* cited by examiner

ELECTRONIC TESTER AND TESTING METHOD

TECHNICAL FIELD

The disclosure relates to electronic tester and a respective testing method.

BACKGROUND

Although applicable to any test system or tester for electronic devices, the present disclosure will mainly be described in conjunction with compliance testers for electronic communication devices.

When testing compliance of an electronic communication device, dedicated test systems with respective control hardware and software for controlling a respective device under test, DUT, are required, wherein individual control hardware and software is provided for each type of DUT.

Accordingly, there is a need for simplifying compliance testing.

SUMMARY

The above stated problem is solved by the features of the independent claims. It is understood, that independent claims of a claim category may be formed in analogy to the dependent claims of another claim category.

Accordingly, it is provided:

An electronic tester comprising at least one test fixture that couples to the device under test, at least one test instrument coupled to at least one of the test fixtures that measures signals in the device under test via the at least one of the test fixtures, a test controller that controls the device under test while the test is performed, and an adapter module comprising a general control interface that is coupled to the test controller, and a DUT-specific communication interface that couples to the device under test to communicate with the device under test, wherein the test controller controls the device under test with generic control signals sent to the general control interface; and wherein the adapter module translates the generic control signals into DUT-specific control signals and transmits the DUT-specific control signals to the device under test.

Further, it is provided:

A method for testing a device under test, the method comprising coupling at least one test fixture to the device under test, measuring signals in the device under test with at least one test instrument coupled to the device under test via the at least one of the test fixtures, coupling an adapter module via a general control interface with a test controller, and via a DUT-specific communication interface with the device under test to communicate with the device under test, providing from the test controller generic control signals to the general control interface for controlling the device under test, translating the generic control signals into DUT-specific control signals with the adapter module, and transmitting the DUT-specific control signals to the device under test.

In known testing systems, especially compliance testing systems, devices under test, also called DUTs, may be tested for their conformance or compliance with respective specifications or standards. To this end, the DUT is controlled via a test system to generate respective signals that may then be measured in the test system. The conformance of the measured signals with the respective specification or standard may then be verified e.g., by analyzing the measured signals.

A compliance test for an ethernet physical layer, PHY, may for example comprise testing at least a subset of the following characteristics:
  Maximum transmitter output droop
  Transmitter clock frequency
  Transmitter timing master jitter
  Transmitter timing slave jitter
  Transmitter distortion
  Transmitter power spectral density (PSD)
  Transmitter peak differential output It is understood, that the electronic tester may also be used to test conformance with other communication or bus protocols, like for example at least one of ART/RS232, CAN, CAN FD, LIN, FlexRay, CPXI, MIL-1553, ARINC-429, SENT, USB 2.0, USB 3.1 Gen1, USB 3.1 Gen2, USB 3.2, USB PD, USB SSIC, 10BASE-T, 100BASE-Tx, 1000BASE-T, 10GBASE-T, Energy Efficient Ethernet, NBASE-T Alliance/Ethernet Alliance 2.5/5G Ethernet, 10BASE-T1, 100BASE-T1, 1000BASE-T1, MIPI D-PHY, CSI, DSI, M-PHY, UniPro, RFFE, DDR3, DDR4, eMMC, PCI Express 1.1/2.0, PCI Express 3.0, MDIO or SpaceWire.

Usually, known test systems require DUT-specific hardware and software to perform tests with a specific type of device under test. Such DUT-specific hardware and software requires a large number of manual steps to prepare the test. In addition, a plurality of manual steps are also required during the test to set respective operation modes in the DUT via the test system.

The present disclosure provides the electronic tester for testing a device under test that allow automatically performing tests, especially conformance tests, with electronic devices under test like for example, Ethernet controllers or other communication controllers.

To this end the electronic tester comprises at least one test fixture that couples to the device under test, and at least one test instrument that couples to the test fixtures to measure signals in the device under test. In this setup the test fixtures serve as a kind measurement adapter. The test fixtures may mechanically adapt the connectors of the measurement instrument to the connection points on the device under test by providing the respective connectors. In addition, the test fixtures may provide electrical modifications to the measured signals, like at least one of filtering, amplifying, and attenuating the measured signals prior to providing the measured signals to the test instrument.

It is understood, that the electronic tester may comprise one test fixture and one respective test instrument. In other implementations, the electronic tester may comprise multiple test fixtures and one test instrument coupled to the multiple test fixtures, multiple test fixtures and multiple test instruments coupled to the multiple test fixtures, or one test fixture and multiple test instruments coupled to the test fixture. It is understood, that even if multiple test instruments are provided a single test instrument may be coupled to multiple test fixtures or vice versa.

The test instruments may for example comprise oscilloscopes or vector network analyzers. Of course, the present disclosure is not limited to these two types of test instruments.

The electronic tester further comprises a test controller for controlling a device under test when performing an electronic test on the respective device under test.

The test controller is coupled to the device under test via an adapter module. The adapter module comprises a general control interface that couples the adapter module to the test controller. In addition, the adapter module comprises a DUT-specific communication interface that couples the adapter module to the respective device under test.

The adapter module receives generic control signals from the test controller and transforms the generic control signals into DUT-specific control signals that are then provided to the device under test via the general control interface.

The test controller may be provided as a configurable logic device like e.g., a CPLD, a FPGA, or an ASIC. As alternative, the test controller may also be provided as a programmable logic device like e.g., a processor, a controller, a microcontroller, or a microprocessor, with a memory that stores respective computer-executable instructions. In another embodiment, the test controller may be provided as a combination of multiple devices like configurable and programmable logic devices. The test controller may at least in part also be provided as a computer program product comprising computer readable instructions that may be executed by a processing element. In a further embodiment, the processor may be provided as addition or additional function or method to the firmware or operating system of a processing element that is already present in the respective application.

In addition, it is understood, that any required supporting or additional hardware may be provided like e.g., a power supply circuitry and clock generation circuitry.

With the test controller and the adapter module the electronic tester allows controlling any type of device under test with a generic test controller. Only the adapter module needs to be provided individually for each type of device under test that is to be tested with the electronic tester.

The capability of the adapter module of translating generic control signals into DUT-specific control signals allows using pre-configured test sequences in the test controller that control the test controller to output predefined sequences of generic control signals. Such a pre-configured test sequence may then be used with any type of device under test. The adapter module that receives the generic control signals then translates the generic control signals into DUT-specific control signals that control the device under test accordingly.

The test of the device under test may therefore be performed without any manual intervention by a user of the electronic tester. Further, generic test controllers may be used to perform the testes like for example, compliance tests for a communication system or standard, and more especially compliance tests of the physical layer of the respective communication system or standard.

Further embodiments of the present disclosure are subject of the further dependent claims and of the following description, referring to the drawings.

In an embodiment, the adapter module may comprise computer readable instructions that are executed by a processor of the test controller.

The adapter module may be provided as a computer program product module. Such an adapter module may comprise computer-executable instructions that when executed by a processor cause the processor to perform the function of the adapter module as described in this disclosure. Such functions may include at least one of receiving the generic control signals, translating the generic control signals into DUT-specific control signals, and transmitting the DUT-specific control signals to the device under test.

It is understood, that such an adapter module may be executed as function or module in a computer program that is executed in the test controller. Receiving and transmitting signals may therefore be performed via respective interfaces, like APIs, callable functions, or the like.

In addition, such an adapter module may be loaded during operation of the test controller as required. Testing of a new device under test may therefore be performed with minimal effort, because it will only be required to load the respective adapter module in the test controller and start a respective test sequence.

The general control interface may in such an embodiment for example be provided as an interface definition that defines what callable functions the adapter module has to provide. Such functions may include at least one of functions to set a specific mode of operation of the device under test, functions to cause the device under test to output specific signals i.e., signals like sine waves, sawtooth signals, step signals or the like, and functions to cause the device under test to generate and output specific standard or test signals like e.g. specific signals of a communication standard.

At the beginning of a test, the test controller may configure the test mode for the DUT. The DUT may then start transmitting specific test signals that are captured by the test instrument. The test instrument may analyze the measured signals or provide the measured to signals to another device for further analysis, for example to the test controller.

The DUT-specific communication interface may be provided as functions in the adapter module that transmit respective control signals to the device under test via a hardware communication interface that is provided in the hardware that provides the test controller.

In another embodiment, the adapter module may comprise a hardware module, wherein the general control interface may comprise a first hardware interface on the hardware module for coupling to the test controller, and wherein the DUT-specific communication interface may comprise a second hardware interface on the hardware module for coupling to the device under test.

The adapter module may also be provided as a dedicated hardware module that comprises one or more first hardware interfaces as the general control interface and one or more second hardware interfaces as the DUT-specific communication interface.

Such an adapter module may be provided externally to the hardware that implements the test controller or as a pluggable hardware module or card that may be plugged into the hardware that implements the test controller.

A hardware-based adapter module allows generating the DUT-specific control signals via a dedicated interface that may be provided on the adapter module. Such a dedicated interface may be provided independently of the hardware that implements the test controller. Therefore, any interface as required by the device under test may be provided, even if such an interface is not present in the hardware that implements the test controller.

In a further embodiment, the adapter module may comprise an adapter controller that receives the generic control signals and translates the received generic control signals into the DUT-specific control signals.

The adapter controller may implement the logic of transforming or translating the generic control signals into DUT-specific control signals. Such a logic may especially be required if the content of the generic control signals is not compatible with the content as expected by device under test. This may be the case, even if the hardware interface for transmitting data between the test controller and the device under test would be compatible.

The adapter controller may for example comprise a mapping table that comprises the respective DUT-specific control signals for respective generic control signals that may be received from the test controller. The adapter controller may after receiving a generic control signal look up the respective DUT-specific control signal in such a mapping table and transmit the respective DUT-specific control signal to the device under test.

It is understood, that the generic control signals may also comprise variable parameters and that the adapter controller may also include such variable parameters into the DUT-specific control signals after looking them up in the mapping table. Further, the mapping table may also comprise mapping rules or formulas for mapping the variable parameters from the generic control signals to the DUT-specific control signals, if necessary.

A device under test may for example expect a frequency value in Hertz, Hz, while the generic control signals may provide the frequency value in Kilohertz, kHz. In that case, the adapter controller may multiply the provided value in Kilohertz with 1000 to provide a value in Hertz, Hz.

The adapter controller may be provided as a configurable logic device like e.g., a CPLD, a FPGA, or an ASIC. As alternative, the adapter controller may also be provided as a programmable logic device like e.g., a processor, a controller, a microcontroller, or a microprocessor, with a memory that stores respective computer-executable instructions. In another embodiment, the adapter controller may be provided as a combination of multiple devices like configurable and programmable logic devices. The adapter controller may at least in part also be provided as a computer program product comprising computer readable instructions that may be executed by a processing element. In a further embodiment, the adapter controller may be provided as addition or additional function or method to the firmware or operating system of a processing element that is already present in the respective application.

In addition, it is understood, that any required supporting or additional hardware may be provided like e.g., a power supply circuitry and clock generation circuitry.

The test controller may in embodiments be provided as dedicated device or unit that may be coupled via respective interfaces to the test instruments.

In yet another embodiment, the test controller may be provided in one of the at least one test instruments.

The test controller may as alternative to being provided as a dedicated unit, also be provided in one of the test instruments. The test instruments may for example comprise a processor with respective peripherals and communication interfaces. The test controller may be provided as function or module comprising computer readable instructions that may be executed by the processor and that may use the peripherals and communication interfaces of the processor to communicate with the adapter module.

In another embodiment, the adapter module may be provided in the test instrument that carries the test controller.

The above-presented explanations regarding the test controller may also be applied to the adapter module. The adapter module may be provided as function or module comprising computer readable instructions that may be executed by the processor and that may use the peripherals and communication interfaces of the processor to communicate with the device under test.

In an embodiment, the electronic tester may comprise a test sequence memory comprising for each one of a plurality of test sequences respective generic control signals that form the respective test sequence.

The test sequence memory may store a plurality of different test sequences, wherein each of the test sequences comprises the generic control signals that are required to perform the respective test sequence.

Of course, the test sequences may comprise further information that is required to perform the respective tests, like for example the output that is expected from the device under test in every step of the test sequence.

In such an example, the test controller may verify if the output of the device under test is as expected.

In a further embodiment, the test controller may comprise an adapter identifier that identifies the adapter module and determines which of the generic control signals of all generic control signals that the test controller may generate are compatible with the adapter module.

The test controller may be capable of generating a specific set of standard or generic control signals. This set of generic control signals may comprise all possible generic control signals that may be generated by the test controller for performing any of the required tests on the device under test.

However, specific implementations of the adapter module may support only a subset of the generic control signals, either because the adapter module is not capable of processing all generic control signals or because the respective type of device under test is not capable of processing all generic control signals.

By identifying which of the generic control signals are compatible with the adapter module currently in use in the electronic tester, the test controller may limit the generic control signals to the compatible subset and perform test using only the compatible subset of generic control signals.

In an embodiment, the test controller may determine if all generic control signals used in a test sequence that is to be executed are compatible with the identified adapter module and may provide a warning signals if not all of the generic control signals used in the respective test sequence are compatible with the identified adapter module.

A user of the electronic tester may select a specific test sequence that is to be executed from the test sequence memory. Each test sequence, as explained above, may define a number of generic control signals that are to be executed to perform the respective test sequence.

However, depending on the specific adapter module that is provided in the electronic tester for performing the test, not all generic control signals used in a specific test sequence may be supported by the adapter module.

In such a case, the test controller may provide a warning signal e.g., to a user of the electronic tester. In addition or as alternative, the test controller may continue to perform the test based on the respective test sequence and skip the not-supported generic control signals.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
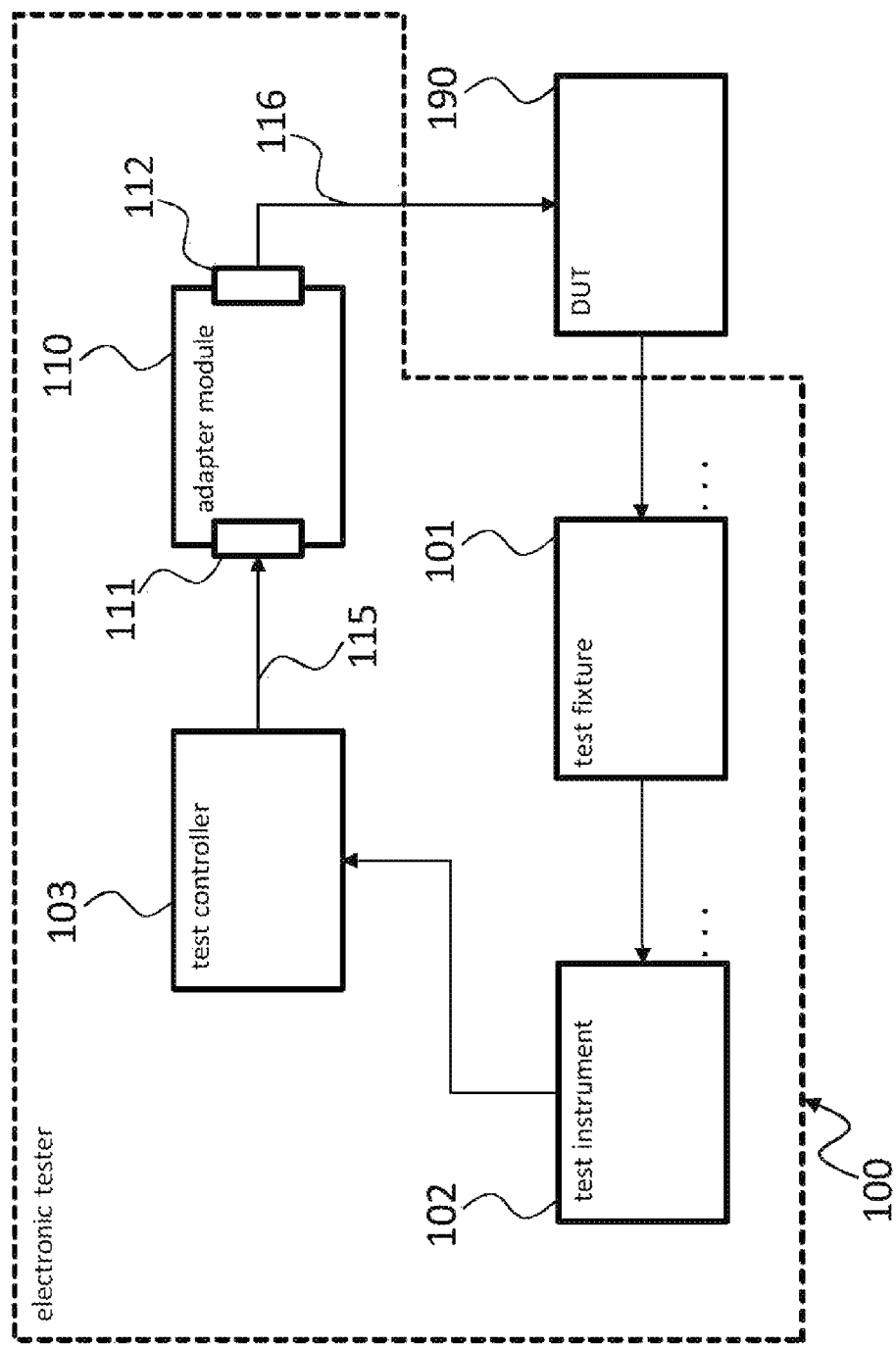
FIG. 1 shows a block diagram of an embodiment of an electronic tester according to the present disclosure.

FIG. 1 shows an electronic tester 100. The electronic tester 100 comprises a test fixture 101 that is coupled to a test instrument 102. The test instrument 102 is coupled to a test controller 103, and the test controller 103 is coupled to an adapter module 110. The electronic tester 100 serves to test a device under test, also called DUT, 190, especially to perform conformance tests with the DUT 190.

The DUT 190 may for example be a communication circuit that allows communicating in a communication system that conforms to a specific communication standard, like for example Ethernet, WiFi, GSM, UMTS, LTE or any other communication standard, especially future communication standard that may be developed in the future.

To perform a test with the DUT 190, the test controller 103 may control the DUT 190 to enter specific modes of operation. The test instrument 102 may then measure signals in the DUT 190 via the test fixture 101.

The test fixture 101 in the electronic tester 100 is a kind of adapter that allows at least mechanically coupling the test instrument 102 to the DUT 190. To this end, the test fixture 101 may comprise respective connectors, like for example BNC connectors or similar connectors for coupling to the test instrument 102, and ethernet connectors for coupling to the DUT 190. Of course, the test fixture 101 may also comprise electronic circuitry like at least one of filters, attenuators, and amplifiers.

The connection between the test controller 103 and the test instrument 102 is optional and may be omitted. In such an embodiment, a user may evaluate the measured signals e.g., on a display of the test instrument 102.

If the connection between the test controller 103 and the test instrument 102 is present, the test controller 103 may receive the measured signals from the test instrument 102 and automatically evaluate the measured signals to determine if the DUT 190 passes the test or not.

The test controller 103 may control the DUT 190 by issuing generic control signals 115 to the adapter module 110. The adapter module 110 comprises a general control interface 111 for communicating with the test controller 103 and receiving the generic control signals 115. In addition, the adapter module 110 comprises a DUT-specific communication interface 112 for communicating with the DUT 190.

The adapter module 110 after receiving the generic control signals 115 transforms the generic control signals 115 into DUT-specific control signals 116.

The generic control signals 115 comprise single signals or commands that are formulated in a generic fashion but are not specifically adapted to control a specific type of DUT 190.

Such generic control signals 115 or commands may comprise signals or commands to control the DUT 190 to perform at least one of the following functions:
  put the DUT into a specific mode of operation
  output specific signals on specific ports
  output specific test or standard signals on specific ports The adapter module 110 transforms these generic signals or commands into signals that may be received and processed by the DUT 190. To this end, the adapter module 110 may perform an electric transformation of the generic control signals 115. Such an electric transformation may for example comprise level-shifting, or transforming a single-ended signal into a differential signal of vice versa. If required, the adapter module 110 may also perform a logical transformation of the content of the generic control signals 115. Such a transformation may comprise processing the received generic control signals 115 in the adapter module 110 and generating new signal content based on the received generic control signals 115 that may then be transmitted to the DUT 190 in the DUT-specific control signals 116.

Figure 2:
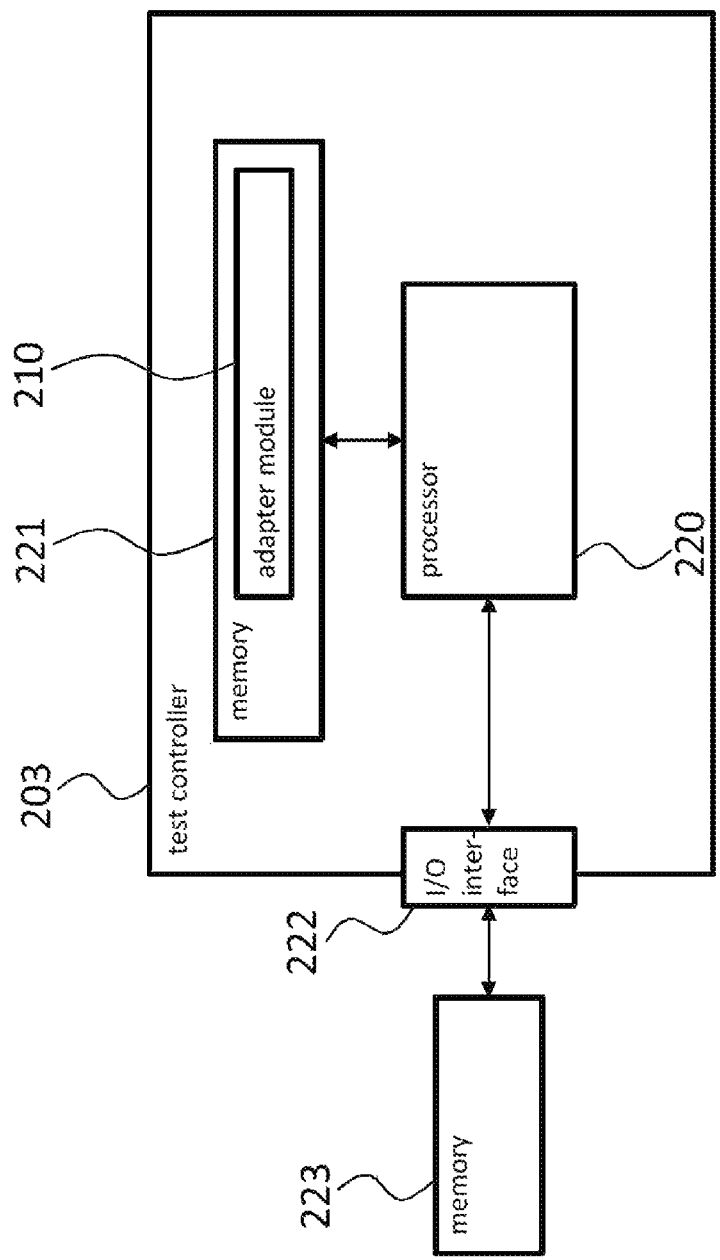
FIG. 2 shows a block diagram of an embodiment of a test controller according to the present disclosure.

FIG. 2 shows a block diagram of a test controller 203. The test controller 203 comprises a processor 220 and a memory 221 that is coupled to the processor 220. The processor 220 is further coupled to an input/output interface 222 for communicating with an external memory 223, that may also form part of the electronic tester. Although not explicitly shown, the test controller 203 may also comprise an interface to communicate with the DUT. This interface in the test controller 203 provides the DUT-specific communication interface.

In the test controller 203 the adapter module 210 is provided as a module comprising computer readable instructions that are stored in the memory 221. Although not explicitly shown, it is understood that other computer readable instructions, for example the instructions of an operating software or operating system of the test controller 203 may also be stored in the memory 221.

In addition or as an alternative to storing the adapter module 210 in the internal memory 221, the computer readable instructions forming the adapter module 210 may also be stored in the external memory 223. It is understood, that the input/output interface 222 may be any kind of interface that allow the processor 220 to access an external memory. The input/output interface 222 may for example comprise an SPI-interface, a USB interface, a SD-Card interface, a network interface or the like. The external memory 223 may comprise a respective memory, like an SD-Card, a USB-Stick, or a network server.

With an adapter module 210 that is provided at least in part as computer readable instructions, the processor 220 may execute the function of the adapter module 210 by executing the respective instructions. The adapter module 210 may provide a respective interface, like for example an API or a predefined set of callable functions, that may be called by an operating software or operating system of the test controller 203.

As alternative, the external memory 223 may be a server that implements the adapter module 210 and is accessible via a respective API like e.g., a REST-based API.

Figure 3:
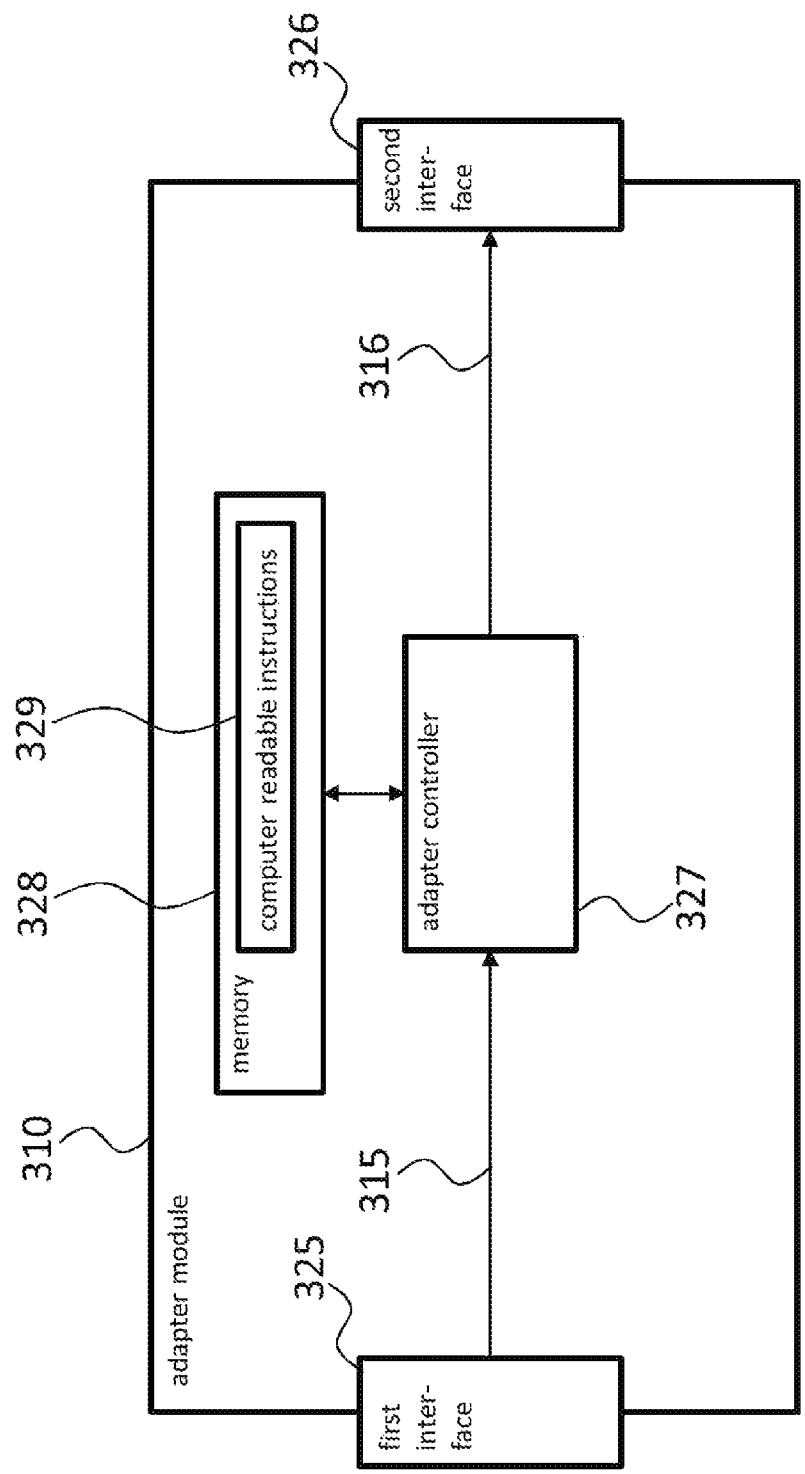
FIG. 3 shows a block diagram of an embodiment of an adapter module according to the present disclosure.

FIG. 3 shows a block diagram of a hardware-based adapter module 310 that may be coupled to or inserted into a test controller according to the present disclosure. The adapter module 310 comprises an adapter controller 327 that is coupled to a first interface 325 and second interface 326. In addition, a memory 328 is provided that is coupled to the adapter controller 327 and comprises computer readable instructions 329.

In the adapter module 310, the first interface 325 implements the general control interface for communicating with the test controller. The second interface 326 implements the DUT-specific communication interface for communicating with the DUT.

In case that only electrical signal transformation is required between the first interface 325 and the second interface 326, the adapter controller 327 may be provided as a respective circuit without active digital components. Of course, in such an embodiment, the memory 328 may be omitted.

In case that active transformation of the content of the signals between the first interface 325 and the second interface 326 is required, the adapter controller 327 may comprise a respective element, like a configurable logic device, for example a CPLD, a FPGA, or an ASIC, or a programmable logic device, for example a processor, a controller, or a microcontroller. Such an element may perform any content modification that is required to transform the generic control signals into DUT-specific control signals.

Figure 4:
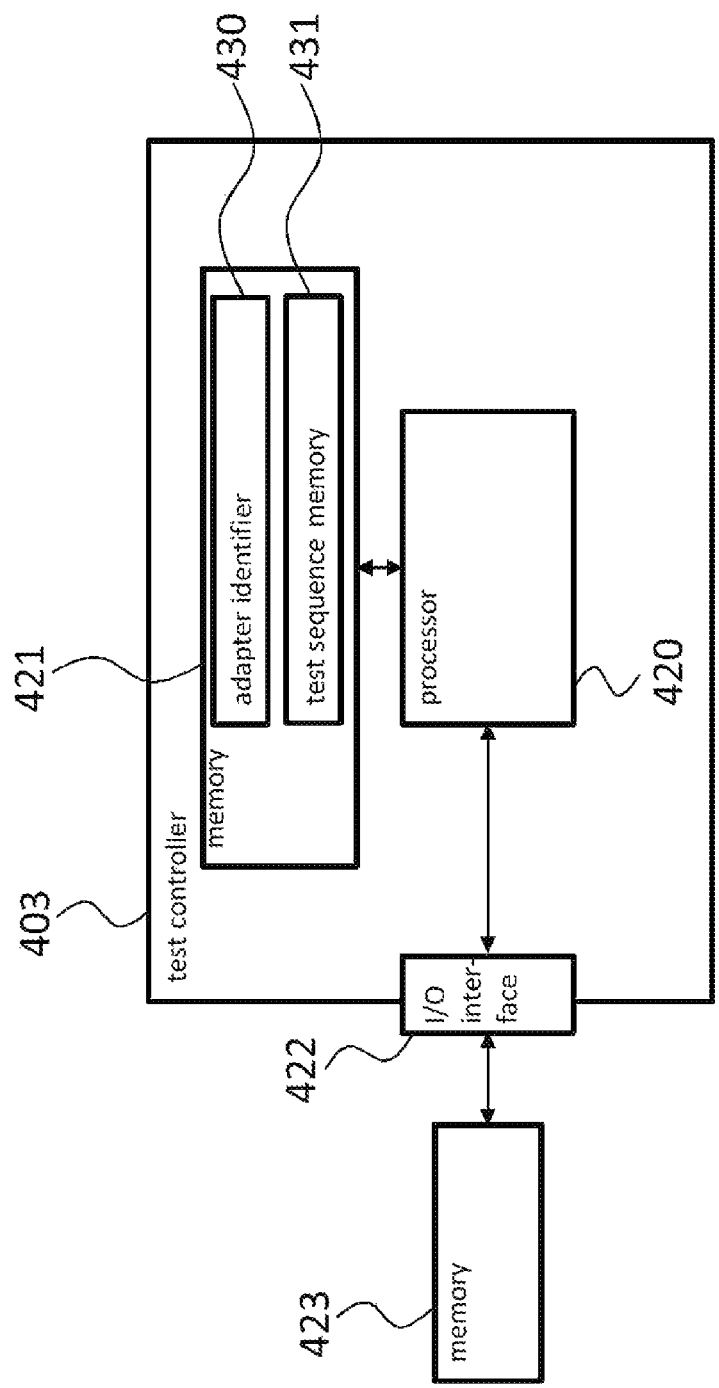
FIG. 4 shows a block diagram of another embodiment of a test controller according to the present disclosure.

FIG. 4 shows a block diagram of a test controller 403. The test controller 403 comprises a processor 420 and a memory 421 that is coupled to the processor 420. The processor 420 is further coupled to an input/output interface 422 for communicating with an external memory 423, that may also form part of the electronic tester. Although not explicitly shown, the test controller 403 may also comprise an interface to communicate with the DUT. This interface in the test controller 403 provides the DUT-specific communication interface. The explanations provided above for the test controller 203 of FIG. 2 also apply to the test controller 403 mutatis mutandis.

The memory 421 stores data or computer readable instructions for an adapter identifier 430 and a test sequence memory 431. It is understood, that the adapter identifier 430 and the test sequence memory 431 are both optional and only one of the two may be provided in the test controller 403.

The adapter identifier 430 enables the processor 420 to identify an adapter module that may be provided in an electronic tester, either as hardware module or module comprising computer readable instructions in the test controller 403. The adapter identifier 430 may also identify the capabilities of the respective adapter module and identify which of the generic control signals of all generic control signals that the test controller 403 may generate are compatible with the adapter module.

The test sequence memory 431 may store sequences of commands that are to be executed to perform a specific electronic test. Such commands may include commands that are internally executed in the test controller 403 and commands that may be transmitted to the DUT or other elements in the electronic tester.

The processor 420 may, therefore, verify if all generic control signals used in a test sequence that is to be executed are compatible with the identified adapter module and provide a warning signal if not all of the generic control signals used in the respective test sequence are compatible with the identified adapter module.

For sake of clarity in the following description of the method-based FIG. 5 the reference signs used above in the description of apparatus-based FIGS. 1-4 will be maintained.

Figure 5:
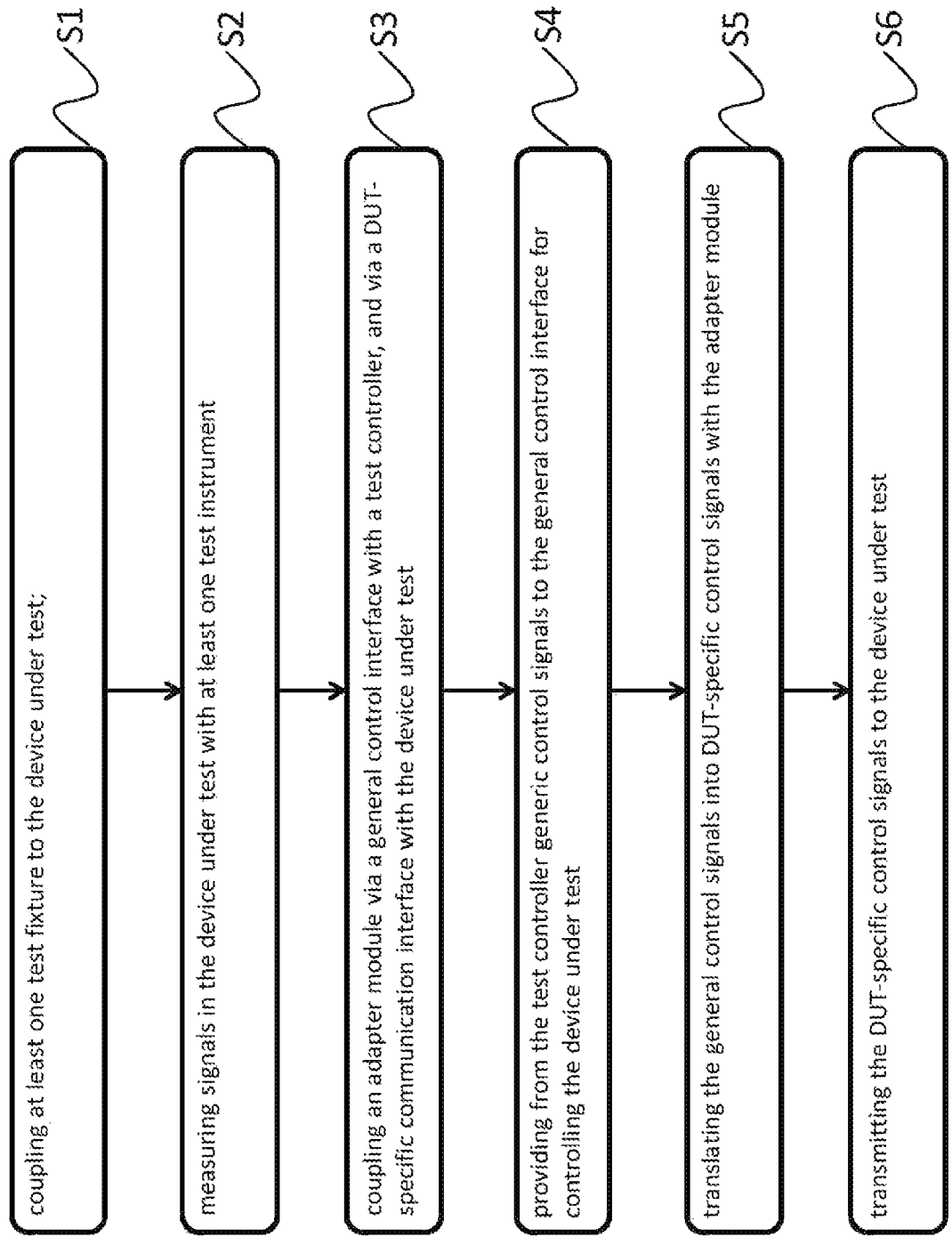
FIG. 5 shows a flow diagram of an embodiment of a method according to the present disclosure.

FIG. 5 shows a flow diagram of an embodiment of a method according to the present disclosure.

The method for testing a device under test 190 comprises coupling at least one test fixture 101 to the device under test 190, and measuring signals in the device under test 190 with at least one test instrument 102 coupled to the device under test 190 via the at least one of the test fixtures 101. Further an adapter module 110, 210, 310 is coupled via a general control interface 111 with a test controller 103, 203, 403, and via a DUT-specific communication interface 112 with the device under test 190 to communicate with the device under test 190. From the test controller 103, 203, 403 generic control signals 115, 315 are provided to the general control interface 111 for controlling the device under test 190. The generic control signals 115, 315 are translated into DUT-specific control signals 116, 316 with the adapter module 110, 210, 310, and are transmitted to the device under test 190 as the DUT-specific control signals 116, 316.

The adapter module 110, 210, 310 may comprise computer readable instructions 329 that are executed by a processor of the test controller 103, 203, 403.

The adapter module 110, 210, 310 may as alternative also comprise a hardware module, wherein the general control interface 111 may comprise a first hardware interface 325 on the hardware module that is coupled to the test controller 103, 203, 403, and wherein the DUT-specific communication interface 112 may comprise a second hardware interface 326 on the hardware module that is coupled to the device under test 190.

The method may further comprise with an adapter controller 327 of the adapter module 110, 210, 310 receiving the generic control signals 115, 315 and translating the received generic control signals 115, 315 into the DUT-specific control signals 116, 316.

The adapter module 110, 210, 310 may be provided in the test instrument 102 that carries the test controller 103, 203, 403. The method may further comprise storing in a test sequence memory 431 for each one of a plurality of test sequences respective generic control signals 115, 315 that form the respective test sequence.

The method may also comprise identifying the adapter module 110, 210, 310 and determining which of the generic control signals 115, 315 of all generic control signals 115, 315 that the test controller 103, 203, 403 may generate are compatible with the adapter module 110, 210, 310. It may be determined if all generic control signals 115, 315 used in a test sequence that is to be executed are compatible with the identified adapter module 110, 210, 310. A warning signals may be provided if not all of the generic control signals 115, 315 used in the respective test sequence are compatible with the identified adapter module 110, 210, 310.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

It is understood, that the adapter module 110, 210, 310 may be provided as dedicated entity that may be connected to a test controller 103, 203, 403. As alternative the adapter module 110, 210, 310 may be provided as hardware module in the test controller 103, 203, 403 or as module comprising computer readable instructions 329 that are executed by a processor of the test controller 103, 203, 403. A combination of hardware and computer readable instructions is also possible.

LIST OF REFERENCE SIGNS

| | |
|---|---|
| 100 | electronic tester |
| 101 | test fixture |
| 102 | test instrument |
| 103, 203, 403 | test controller |
| 110, 210, 310 | adapter module |
| 111 | general control interface |
| 112 | DUT-specific communication interface |
| 115, 315 | generic control signal |
| 116, 316 | DUT-specific control signal |
| 220, 420 | processor |
| 221, 421 | memory |
| 222, 422 | input/output interface |
| 223, 423 | external memory |
| 325 | first interface |
| 326 | second interface |
| 327 | adapter controller |
| 328 | memory |
| 329 | computer readable instructions |
| 430 | adapter identifier |
| 431 | test sequence memory |
| 190 | device under test |
| S1-S6 | method steps |

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electronic tester comprising:
at least one test fixture that couples to a device under test;
at least one test instrument coupled to at least one of the test fixtures that measures signals in the device under test via the at least one of the test fixtures;
a test controller that controls the device under test while the test is performed; and
an adapter module comprising a general control interface that is coupled to the test controller, and a DUT-specific communication interface that couples to the device under test to communicate with the device under test;
wherein the test controller controls the device under test with generic control signals sent to the general control interface;
wherein the adapter module translates the generic control signals into DUT-specific control signals and transmits the DUT-specific control signals to the device under test; and
wherein the test controller comprises an adapter identifier that identifies the adapter module and determines which of the generic control signals of all generic control signals that the test controller may generate are compatible with the adapter module.

2. The electronic tester according to claim 1, wherein the adapter module comprises a computer program product comprising computer readable instructions that are executed by a processor of the test controller.

3. The electronic tester according to claim 1, wherein the adapter module comprises:
a hardware module;
wherein the general control interface comprises a first hardware interface on the hardware module for coupling to the test controller; and
wherein the DUT-specific communication interface comprises a second hardware interface on the hardware module for coupling to the device under test.

4. The electronic tester according to claim 3, wherein the adapter module comprises:
an adapter controller that receives the generic control signals and translates the received generic control signals into the DUT-specific control signals.

5. The electronic tester according to claim 1, wherein the test controller is provided in one of the at least one test instrument.

6. The electronic tester according to claim 5, wherein the adapter module is provided in the test instrument that carries the test controller.

7. The electronic tester according to claim 1, further comprising a test sequence memory comprising for each one of a plurality of test sequences respective generic control signals that form the respective test sequence.

8. The electronic tester according to claim 1, further comprising a test sequence memory comprising for each one of a plurality of test sequences respective generic control signals that form the respective test sequence.

9. The electronic tester according to claim 8, wherein the test controller determines if all generic control signals used in a test sequence that is to be executed are compatible with the identified adapter module and provides a warning signal if not all of the generic control signals used in the respective test sequence are compatible with the identified adapter module.

10. A method for testing a device under test, the method comprising:
coupling at least one test fixture to the device under test;
measuring signals in the device under test with at least one test instrument coupled to the device under test via the at least one of the test fixtures;
coupling an adapter module via a general control interface with a test controller, and via a DUT-specific communication interface with the device under test to communicate with the device under test;
providing, from the test controller, generic control signals to the general control interface for controlling the device under test;
translating the generic control signals into DUT-specific control signals with the adapter module;
transmitting the DUT-specific control signals to the device under test; and
identifying the adapter module and determining which of the generic control signals of all generic control signals that the test controller may generate are compatible with the adapter module.

11. The method according to claim 10, wherein the adapter module comprises computer readable instructions that are executed by a processor of the test controller.

12. The method according to claim 10, wherein the adapter module comprises:
a hardware module;
wherein the general control interface comprises a first hardware interface on the hardware module that is coupled to the test controller; and wherein the DUT-specific communication interface comprises a second hardware interface on the hardware module that is coupled to the device under test.

13. The method according to claim 12, further comprising:
with an adapter controller of the adapter module receiving the generic control signals and translating the received generic control signals into the DUT-specific control signals.

14. The method according to claim 10, wherein the test controller is provided in one of the at least one test instrument.

15. The method according to claim 14, wherein the adapter module is provided in the test instrument that carries the test controller.

16. The method according to claim 10, further comprising storing in a test sequence memory for each one of a plurality of test sequences respective generic control signals that form the respective test sequence.

17. The method according to claim 10, further comprising storing in a test sequence memory for each one of a plurality of test sequences respective generic control signals that form the respective test sequence.

18. The method according to claim 17, comprising determining if all generic control signals used in a test sequence that is to be executed are compatible with the identified adapter module and providing a warning signal if not all of the generic control signals used in the respective test sequence are compatible with the identified adapter module.

* * * * *